(12) United States Patent
Sonehara et al.

(10) Patent No.: US 10,438,970 B2
(45) Date of Patent: Oct. 8, 2019

(54) SEMICONDUCTOR MEMORY DEVICE

(71) Applicant: Toshiba Memory Corporation, Minato-ku (JP)

(72) Inventors: Takeshi Sonehara, Yokkaichi (JP); Masaru Kito, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/980,966

(22) Filed: May 16, 2018

(65) Prior Publication Data

US 2018/0269228 A1     Sep. 20, 2018

Related U.S. Application Data

(63) Continuation of application No. 14/845,796, filed on Sep. 4, 2015, now Pat. No. 10,008,510.

(60) Provisional application No. 62/140,891, filed on Mar. 31, 2015.

(51) Int. Cl.
*H01L 27/11582*     (2017.01)
*H01L 27/11565*     (2017.01)
*H01L 27/1157*      (2017.01)
*H01L 27/11575*     (2017.01)

(52) U.S. Cl.
CPC .... *H01L 27/11582* (2013.01); *H01L 27/1157* (2013.01); *H01L 27/11565* (2013.01); *H01L 27/11575* (2013.01)

(58) Field of Classification Search
CPC ......... H01L 27/11565; H01L 27/11582; H01L 27/1157; H01L 27/11575
See application file for complete search history.

(56) References Cited

U.S. PATENT DOCUMENTS

| | | | |
|---|---|---|---|
| 7,936,004 B2 | 5/2011 | Kito et al. | |
| 2007/0252201 A1 | 11/2007 | Kito et al. | |
| 2010/0109071 A1 | 5/2010 | Tanaka | |
| 2013/0270568 A1* | 10/2013 | Rabkin | H01L 29/6675 257/66 |
| 2013/0313627 A1* | 11/2013 | Lee | H01L 21/76816 257/324 |

* cited by examiner

*Primary Examiner* — Dale E Page
*Assistant Examiner* — Quovaunda Jefferson
(74) *Attorney, Agent, or Firm* — Oblon, McClelland, Maier & Neustadt, L.L.P.

(57) ABSTRACT

According to an embodiment, a semiconductor memory device comprises control gate electrodes and a semiconductor layer. The control gate electrodes are stacked above a substrate. The semiconductor layer has as its longitudinal direction a direction perpendicular to the substrate. The semiconductor memory device further comprises first and second control gate electrodes and third and fourth control gate electrodes stacked sequentially above the substrate and first through fourth via contacts connected to these first through fourth control gate electrodes. The third and fourth control gate electrodes face the first and second control gate electrodes. Positions of the first and second via contacts are far from each other. Positions of the third and fourth via contacts are close to each other.

20 Claims, 15 Drawing Sheets

SEMICONDUCTOR MEMORY DEVICE

CROSS-REFERENCE TO RELATED APPLICATIONS

This application is continuation of and claims the benefit of priority under 35 U.S.C. § 120 from U.S. application Ser. No. 14/845,796 filed Sep. 4, 2015, and claims the benefit of priority of U.S. Provisional Patent Application No. 62/140,891 filed Mar. 31, 2015, the entire contents of each of which are incorporated herein by reference.

BACKGROUND

Field

Embodiments described herein relate to a semiconductor memory device.

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

Figure 1:
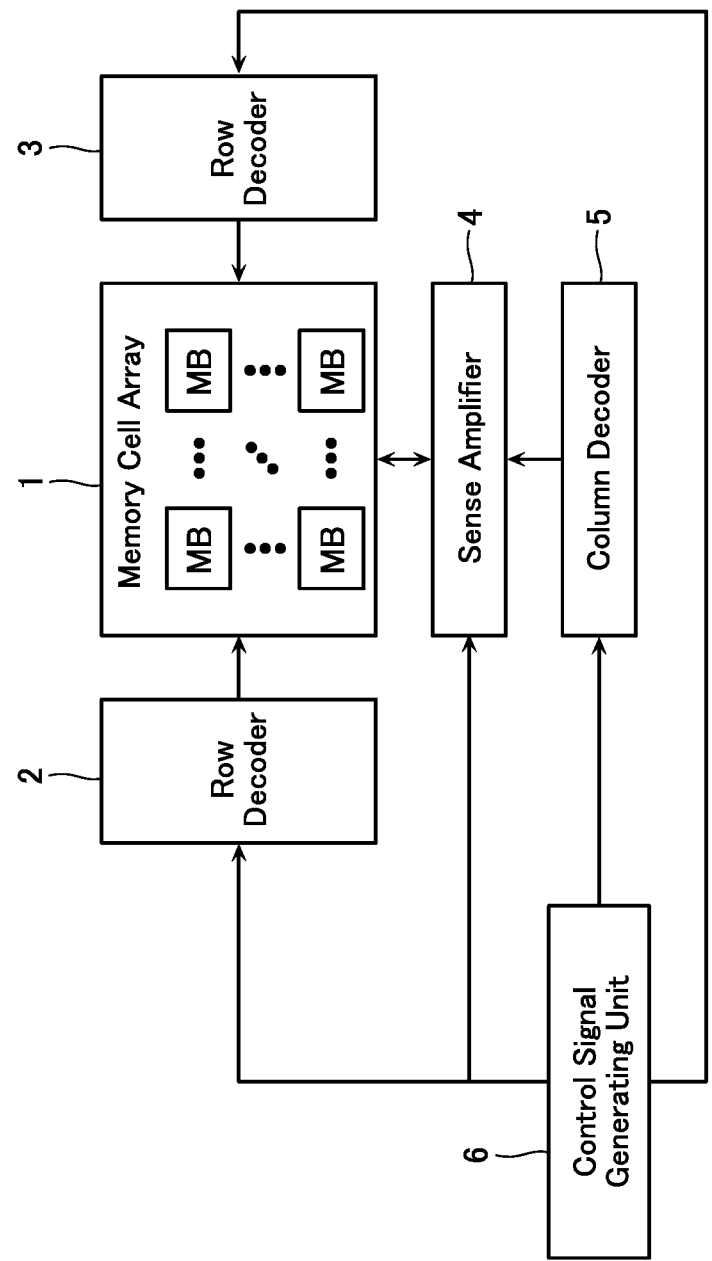
FIG. 1 is a functional block diagram showing a configuration of a semiconductor memory device according to a first embodiment.

A semiconductor memory device according to an embodiment comprises a plurality of control gate electrodes and a semiconductor layer. The plurality of control gate electrodes are stacked above a substrate. The semiconductor layer has as its longitudinal direction a direction perpendicular to the substrate, and faces the plurality of control gate electrodes. In addition, the semiconductor memory device further comprises: first through fourth control gate electrodes arranged in a first direction; and first through fourth via contacts connected to these first through fourth control gate electrodes. The first and second control gate electrodes are stacked sequentially above the substrate. The third and fourth control gate electrodes are stacked sequentially above the substrate and face the first and second control gate electrodes from a first direction. A position in the first direction of the first via contact is further from the third control gate electrode than is a center position in the first direction of the first control gate electrode. A position in the first direction of the second via contact is closer to the fourth control gate electrode than is a center position in the first direction of the second control gate electrode. A position in the first direction of the third via contact is further from the first control gate electrode than is a center position in the first direction of the third control gate electrode. A position in the first direction of the fourth via contact is closer to the second control gate electrode than is a center position in the first direction of the fourth control gate electrode.

Next, nonvolatile semiconductor memory devices according to embodiments will be described in detail with reference to the drawings. Note that these embodiments are merely examples. For example, the nonvolatile semiconductor memory devices described below have a structure in which a memory string extends linearly in a perpendicular direction to a substrate, but a similar structure may be applied also to a U-shaped structure in which the memory string is doubled back on an opposite side midway. In addition, each of the drawings of the nonvolatile semiconductor memory devices employed in the embodiments below is schematic, and thicknesses, widths, ratios, and so on, of layers are not necessarily identical to those of the actual nonvolatile semiconductor memory devices.

Moreover, the embodiments below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor film acting as a channel provided in a column shape perpendicularly to a substrate; and a gate electrode film provided on a side surface of the semiconductor film via a charge accumulation layer. However, a similar structure may be applied also to a memory cell of another form, for example, a SONOS (Semiconductor-Oxide-Nitride-Oxide-Semiconductor) type memory cell or a MANOS (Metal-Aluminum Oxide-Nitride-Oxide-Semiconductor) type memory cell, one employing hafnium oxide ($HfO_x$) or tantalum oxide ($TaO_x$) as an insulating layer, or a floating gate type memory cell.

[First Embodiment]

FIG. 1 is a functional block diagram showing a configuration of a semiconductor memory device according to a first embodiment. The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or an erase operation, generates a control signal and controls the row decoders 2 and 3, the sense amplifier 4, and the column decoder 5.

Figure 2:
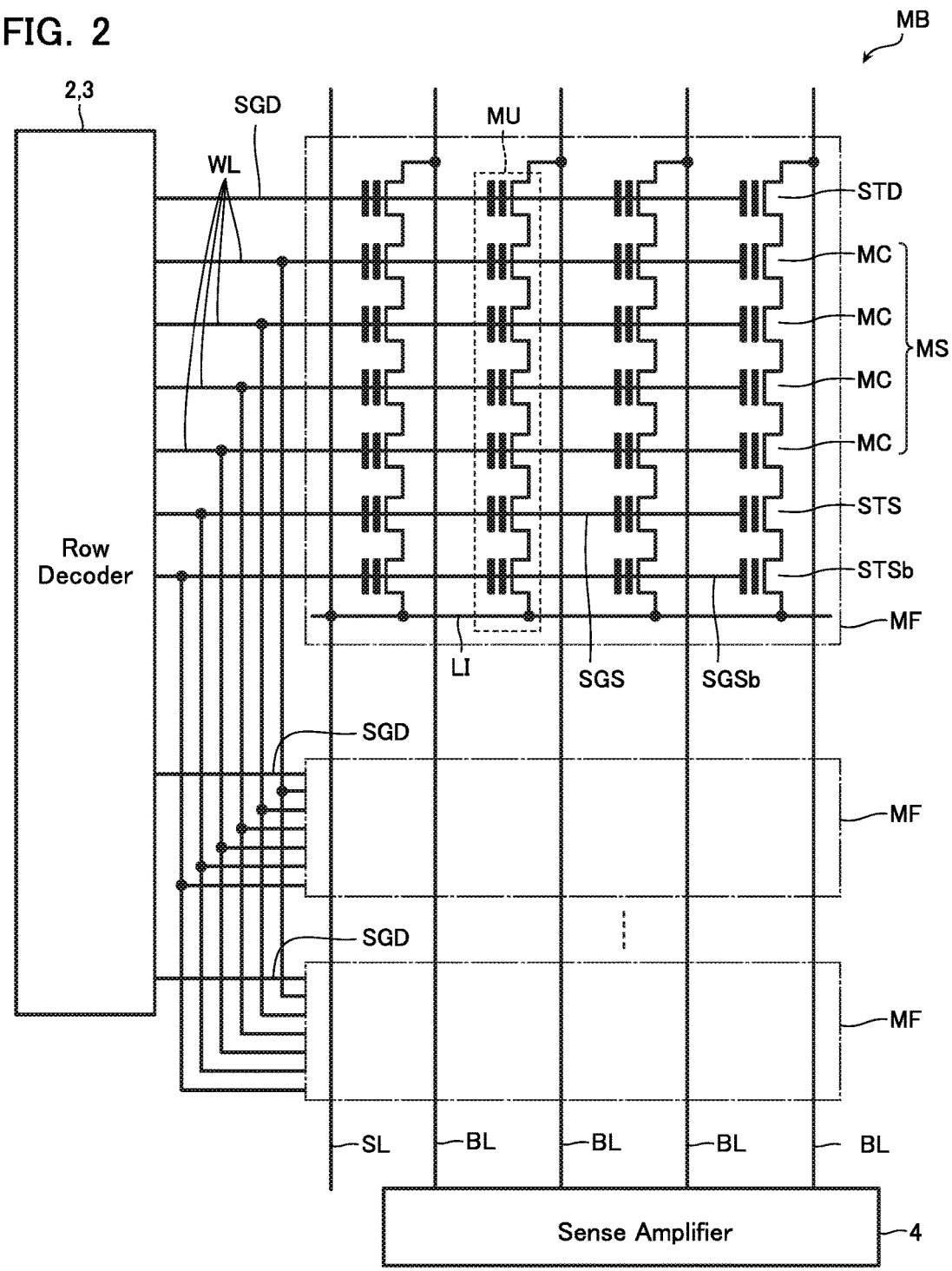
FIG. 2 is an equivalent circuit diagram showing a configuration of a memory cell array 1 of the same semiconductor memory device.

Next, a circuit configuration of part of the memory cell array 1 according to the present embodiment will be described with reference to FIG. 2. FIG. 2 is an equivalent circuit diagram showing a configuration of the memory block MB. In the memory block MB shown in FIG. 2, a certain drain side select gate line SGD and a certain word line WL are selected by the row decoders 2 and 3, and data of a certain number of memory cells MC is read via a certain number of bit lines BL.

As shown in FIG. 2, the memory blocks MB each comprise a plurality of memory fingers MF. Commonly connected to these plurality of memory fingers MF are a plurality of the bit lines BL and a source line SL. Each of the memory fingers MF is connected to the sense amplifier 4 via the bit lines BL, and is connected to an unillustrated source line driver via the source line SL.

The memory finger MF comprises a plurality of memory units MU that have their one ends connected to the bit lines BL and have their other ends connected to the source line SL via a source contact LI. The memory units MU included in one memory finger MF are all connected to different bit lines BL.

As shown in FIG. 2, the memory unit MU comprises a plurality of the memory cells MC connected in series. As will be described later, the memory cell MC comprises a semiconductor layer, a charge accumulation layer, and a control gate, and accumulates a charge in the charge accumulation layer based on a voltage applied to the control gate, thereby changing a threshold value of the memory cell MC. Note that hereafter, the plurality of memory cells MC connected in series will be called a "memory string MS". The row decoders 2 and 3 transfer a voltage to a certain word line WL, thereby transferring this voltage to the control gate of a certain memory cell MC in the memory string MS.

As shown in FIG. 2, commonly connected to the control gates of pluralities of the memory cells MC configuring different memory strings MS are, respectively, the word lines WL. These pluralities of memory cells MC are connected to the row decoder 2 or the row decoder 3 via the word lines WL. Moreover, in the example shown in FIG. 2, the word lines WL are provided independently to each of the memory cells MC included in the memory unit MU, and are provided commonly for all of the memory units MU included in one memory block MB.

As shown in FIG. 2, the memory unit MU comprises a drain side select gate transistor STD connected between the memory string MS and the bit line BL. Connected to a control gate of the drain side select gate transistor STD is the drain side select gate line SGD. The drain side select gate line SGD is connected to the row decoder 2 or the row decoder 3, and selectively connects the memory string MS and the bit line BL based on an inputted signal. Moreover, in the example shown in FIG. 2, the drain side select gate line SGD is provided independently to each of the memory fingers MF, and is commonly connected to the control gates of all of the drain side select gate transistors STD in the memory finger MF. The row decoders 2 and 3 select a certain drain side select gate line SGD, thereby selectively connecting all of the memory strings MS in a certain memory finger MF to the bit lines BL.

Moreover, as shown in FIG. 2, the memory unit MU comprises a source side select gate transistor STS and a lowermost layer source side select gate transistor STSb that are connected between the memory string MS and the source contact LI. Connected to a control gate of the source side select gate transistor STS is a source side select gate line SGS. In addition, connected to a control gate of the lowermost layer source side select gate transistor STSb is a lowermost layer source side select gate line SGSb. Moreover, in the example shown in FIG. 2, the source side select gate line SGS is commonly connected to all of the source side select gate transistors STS in the memory block MB. Similarly, the lowermost layer source side select gate line SGSb is commonly connected to all of the lowermost layer source side select gate transistors STSb in the memory block MB. The row decoders 2 and 3 connect all of the memory strings MS in the memory block MB to the source line SL, based on an inputted signal.

Figure 3:
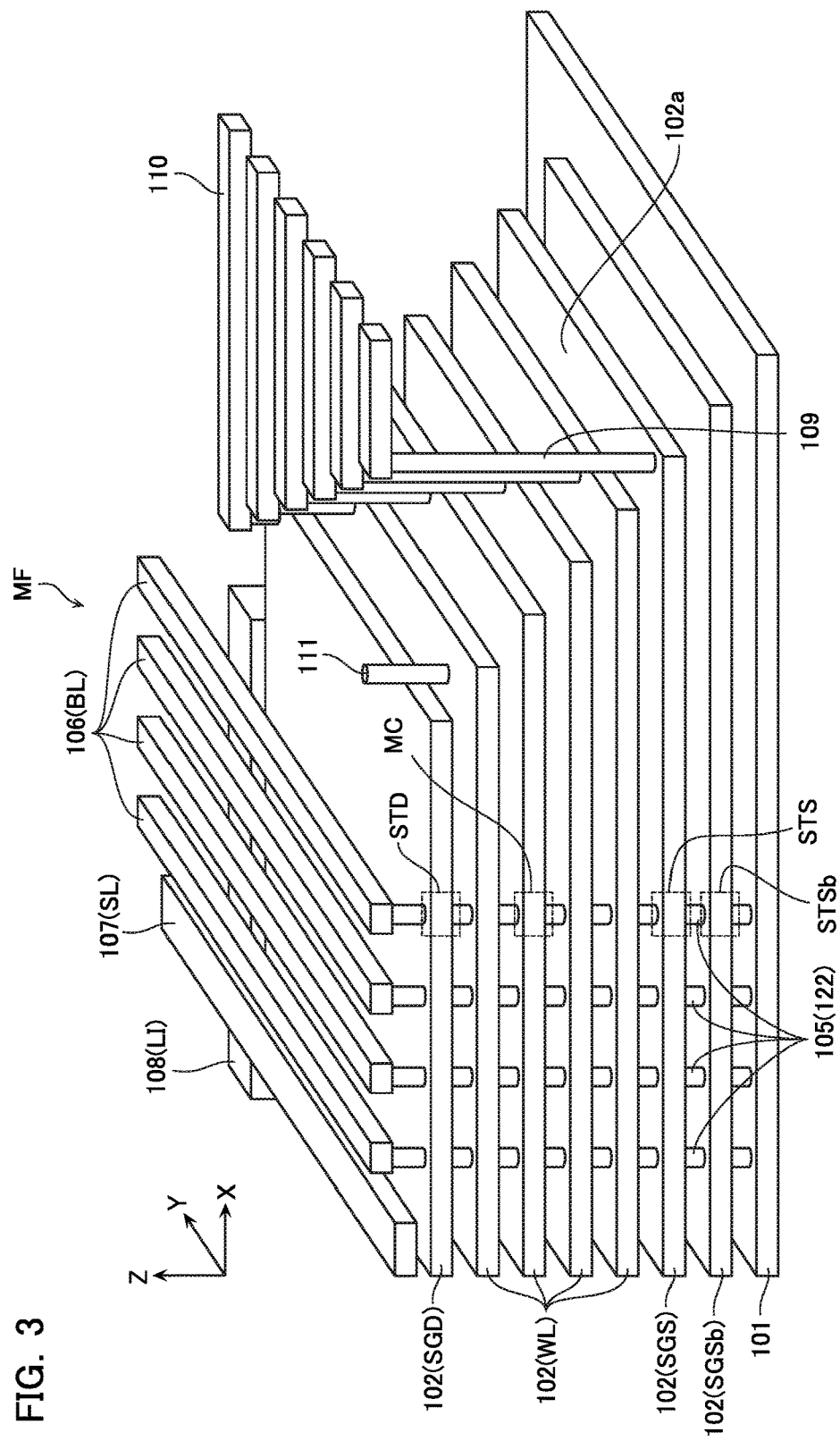
FIG. 3 is a perspective view showing the configuration of the memory cell array 1 of the same semiconductor memory device.

Next, a schematic configuration of the memory cell array 1 will be described with reference to FIG. 3. FIG. 3 is a schematic perspective view showing a configuration of part of the memory finger MF (memory cell group). Note that in FIG. 3, part of the configuration is omitted.

As shown in FIG. 3, the memory finger MF comprises: a substrate 101; and a plurality of conductive layers 102 stacked in a Z direction above the substrate 101. In addition, the memory finger MF includes a plurality of memory columnar bodies 105 extending in the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, the drain side select gate line SGD, and the lowermost layer source side select gate line SGSb.

As shown in FIG. 3, the plurality of conductive layers 102 are formed in steps, at their ends in an X direction. That is, the conductive layer 102 comprises a contact portion 102a that does not face a lower surface of the conductive layer 102 positioned in a layer above it. Moreover, the conductive layer 102 is connected to a via contact wiring line 109 at this contact portion 102a. Moreover, a wiring line 110 is provided at an upper end of the via contact wiring line 109. Note that the via contact wiring line 109 and the wiring line 110 are configured from a conductive layer of the likes of tungsten.

In addition, as shown in FIG. 3, the memory finger MF comprises a support (columnar body) 111. The support 111 communicates with holes provided in the plurality of conductive layers 102. The support 111 supports a posture of an unillustrated insulating layer provided between the conductive layers 102, in a manufacturing step.

Moreover, as shown in FIG. 3, the memory finger MF comprises a conductive layer 108. The conductive layer 108 faces side surfaces in a Y direction of the plurality of conductive layers 102, and extends in the X direction. A lower surface of the conductive layer 108 contacts the substrate 101. The conductive layer 108 is configured from a conductive layer of the likes of tungsten (W), for example, and functions as the source contact LI.

Note that a material of the conductive layer 102 is conceivably configured from a conductive layer of the likes of WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$, for example, besides the above-described tungsten (W).

Moreover, as shown in FIG. 3, the memory finger MF comprises a plurality of conductive layers 106 and a conductive layer 107 that are positioned above the plurality of conductive layers 102 and the memory columnar body 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Figure 4:
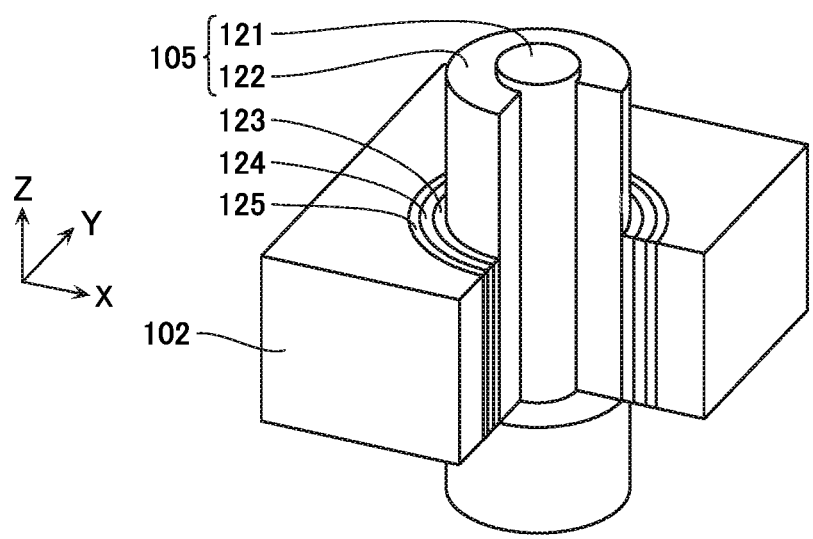
FIG. 4 is a perspective view showing a configuration of a memory cell MC of the same semiconductor memory device.

Next, a schematic configuration of the memory cell MC will be described with reference to FIG. 4. FIG. 4 is a schematic perspective view showing the configuration of the memory cell MC. Note that FIG. 4 shows the configuration of the memory cell MC, but the lowermost layer source side select gate transistor STSb, the source side select gate transistor STS, and the drain side select gate transistor STD may also be configured similarly to the memory cell MC. Note that in FIG. 4, part of the configuration is omitted.

As shown in FIG. 4, the memory cell MC is provided at an intersection of the conductive layer 102 and the memory columnar body 105. The memory columnar body 105 comprises: a core insulating layer 121; and a semiconductor layer 122 that covers a sidewall of the core insulating layer 121. Furthermore, provided between the semiconductor layer 122 and the conductive layer 102 are a tunnel insulating layer 123, a charge accumulation layer 124, and a block insulating layer 125.

The core insulating layer 121 is configured from an insulating layer of the likes of silicon oxide ($SiO_2$), for example. The semiconductor layer 122 is configured from a semiconductor layer of the likes of polysilicon, for example, and functions as a channel of the memory cell MC, the source side select gate transistor STS, and the drain side select gate transistor STD. The tunnel insulating layer 123 is configured from an insulating layer of the likes of silicon oxide ($SiO_2$), for example. The charge accumulation layer 124 is configured from an insulating layer of the likes of silicon nitride (SiN), for example, capable of accumulating a charge. The block insulating layer 125 is configured from an insulating layer of the likes of silicon oxide ($SiO_2$), for example.

A material of the semiconductor layer 122 is conceivably configured from a semiconductor of the likes of SiGe, SiC, Ge, and C, for example, besides the above-described polysilicon. Moreover, a silicide may be formed at a contact surface of the semiconductor layer 122 with the substrate 101 or the conductive layer 106. Conceivably used in such a silicide are, for example, Sc, Ti, VCr, Mn, Fe, Co, Ni, Cu, Zn, Rh, Pd, Ag, Cd, In, Sn, La, Hf, Ta, W, Re, Os, Ir, Pt, Au, and so on. Furthermore, the following may be added to the silicide formed in this way, namely, Sc, Ti, VCr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, Au, and so on.

The tunnel insulating layer 123 or the block insulating layer 125 are conceivably configured from a material of the likes of an oxide or an oxynitride, for example, besides the above-described silicon oxide ($SiO_2$).

Conceivable as the oxide configuring the tunnel insulating layer 123 and the block insulating layer 125 are, for example, $SiO_2$, $Al_2O_3$, $Y_2O_3$, $La_2O_3$, $Gd_2O_3$, $Ce_2O_3$, $Ce_2Ta_2O_5$, $HfO_2$, $ZrO_2$, $TiO_2$, HfSiO, HfAlO, ZrSiO, ZrAlO, AlSiO, and so on.

Moreover, the oxide configuring the tunnel insulating layer 123 and the block insulating layer 125 may be $AB_2O_4$. Note that, A and B referred to here are the same or different elements, and are one of Al, Sc, Ti, V, Cr, Mn, Fe, Co, Ni, Cu, Zn, Ga, and Ge. For example, $AB_2O_4$ is $Fe_3O_4$, $FeAl_2O_4$, $Mn_{1+x}Al_{2-x}O_{4+y}$, $Co_{1+x}Al_{2-x}O_{4+y}$, $MnO_x$, and so on.

Moreover, the oxide configuring the tunnel insulating layer 123 and the block insulating layer 125 may be $ABO_3$. Note that, A and B referred to here are the same or different elements, and are one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $ABO_3$ is $LaAlO_3$, $SrHfO_3$, $SrZrO_3$, $SrTiO_3$, and so on.

Conceivable as the oxynitride configuring the tunnel insulating layer 123 and the block insulating layer 125 are, for example, SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, and so on.

Moreover, the oxynitride configuring the tunnel insulating layer 123 and the block insulating layer 125 may be a material in which some of the oxygen elements of each of the materials mentioned above as the oxide configuring the tunnel insulating layer 123 and the block insulating layer 125 are substituted by a nitrogen element.

Note that the following are preferable as the material of the tunnel insulating layer 123 and the block insulating layer 125, namely, $SiO_2$, SiN, $Si_3N_4$, $Al_2O_3$, SiON, $HfO_2$, HfSiON, $Ta_2O_5$, $TiO_2$, or $SrTiO_3$.

Specifically, Si based insulating films of the likes of $SiO_2$, SiN, and SiON include ones in which concentrations of oxygen elements and nitrogen elements are each $1\times10^{18}$ atoms/cm$^3$ or more.

Moreover, the tunnel insulating layer 123 and the block insulating layer 125 may include an impurity atom forming a defect level or a semiconductor/metal dot (quantum dot).

Figure 5:
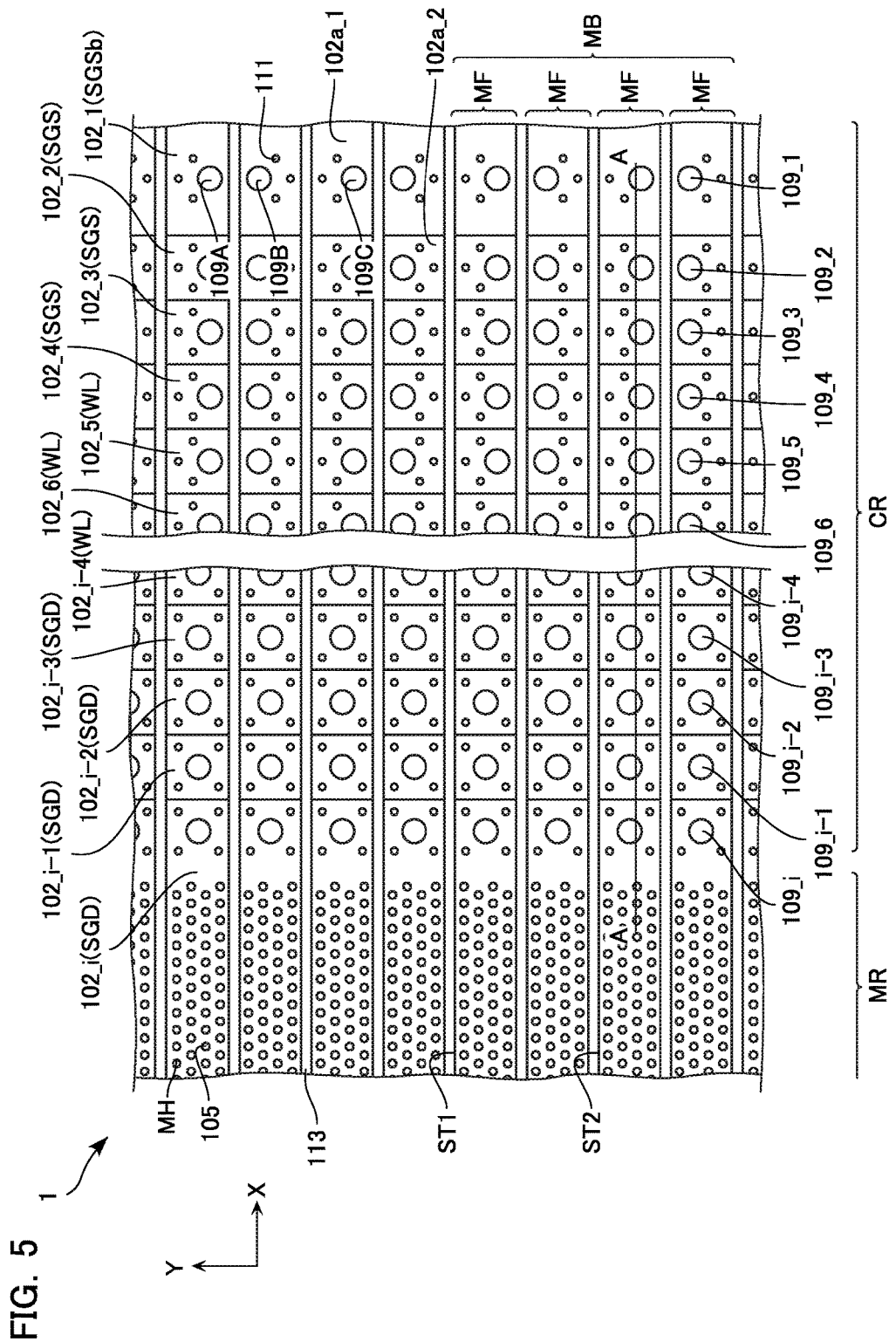
FIG. 5 is a plan view showing the configuration of the memory cell array 1 of the same semiconductor memory device.
Figure 6:
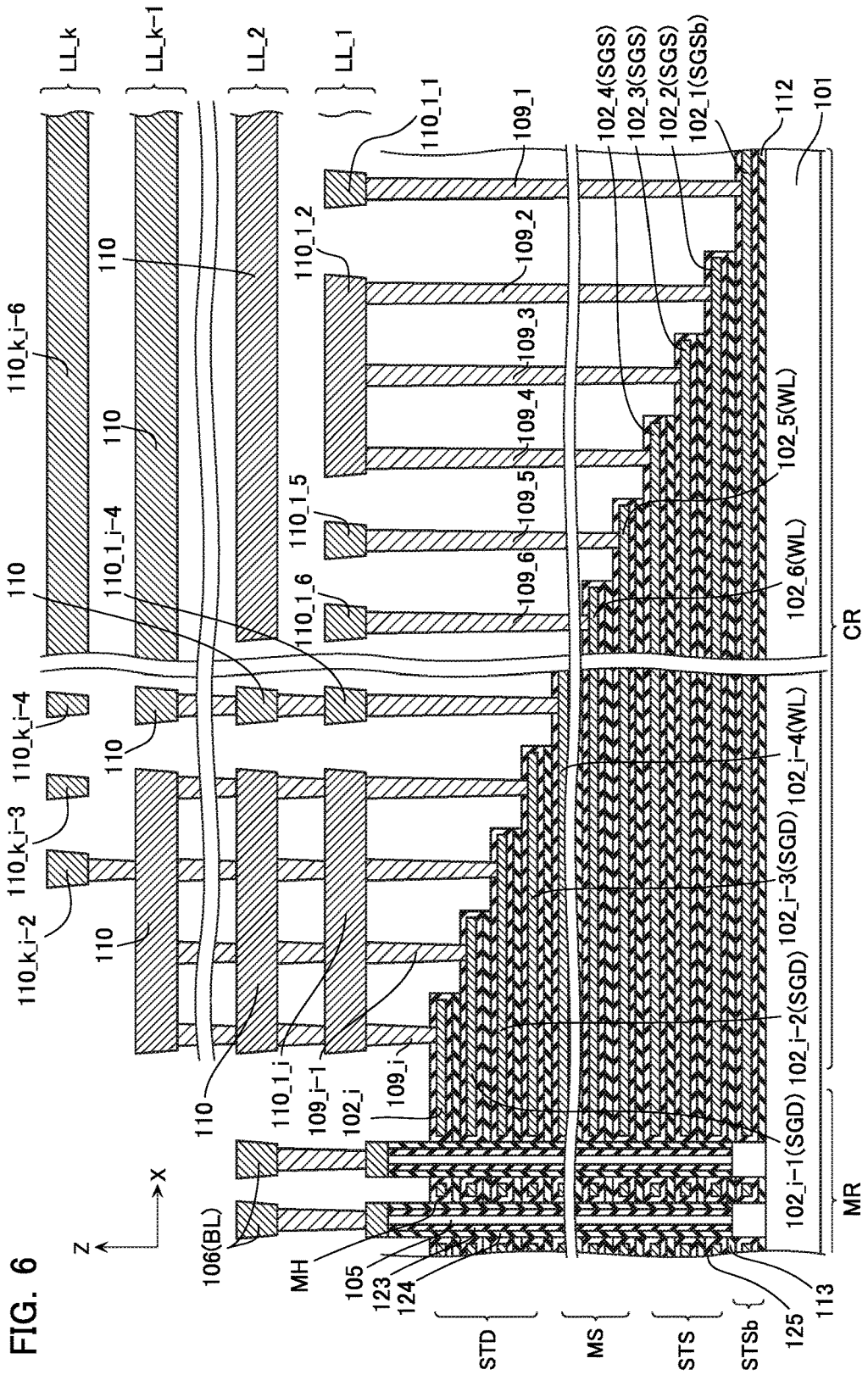
FIG. 6 is a cross-sectional view showing the configuration of the memory cell array 1 of the same semiconductor memory device.
Figure 7:
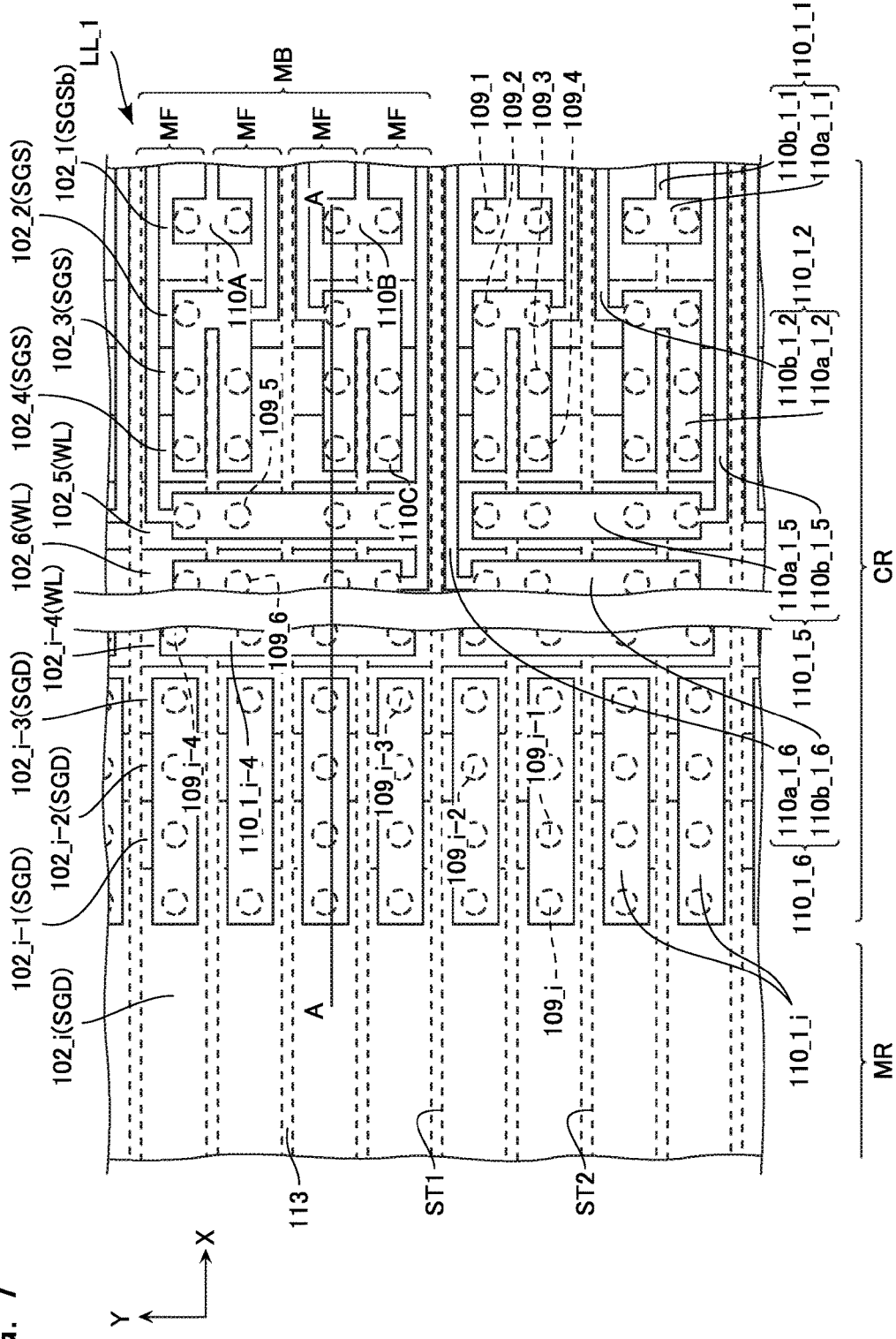
FIG. 7 is a plan view showing a configuration of a wiring line layer LL_1 of the same semiconductor memory device.
Figure 8:
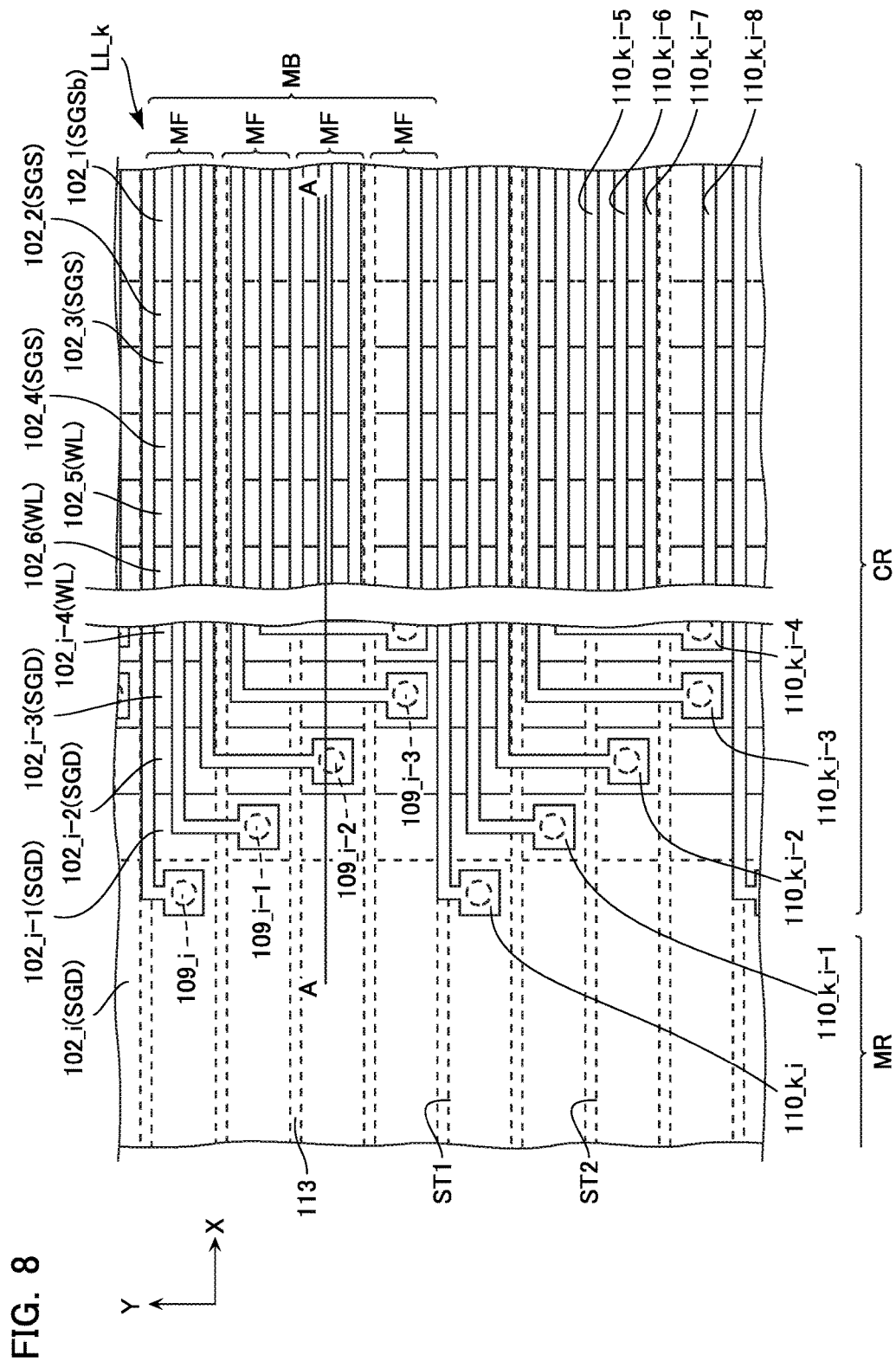
FIG. 8 is a plan view showing a configuration of a wiring line layer LL_k of the same semiconductor memory device.

Next, the configuration of the semiconductor memory device according to the first embodiment will be described in more detail with reference to FIGS. 5 to 8. FIG. 5 is a plan view showing a configuration of part of the memory cell array 1. FIG. 6 is a cross-sectional view of the same memory block, and shows a cross-section taken along the line AA of FIG. 5. Moreover, FIGS. 7 and 8 are plan views of the same memory block, and respectively illustrate wiring line layers LL_1 and LL_k shown in FIG. 6. Note that in each of FIGS. 5 to 8, part of the configuration is omitted. Moreover, the configurations shown in FIGS. 5 to 8 are merely examples, and arrangements of the via contact wiring line 109 or the support (columnar body) 111, configurations of the wiring line layers LL_1 to LL_k, and so on, maybe appropriately changed. Furthermore, FIG. 6 shows a four-layer portion of a k-layer portion of wiring line layers L_1 to LL_k, but the number of layers of wiring line layers LL may be two, or may be three or more, for example.

As shown in FIG. 5, the memory cell array 1 includes a plurality of the memory blocks MB arranged in the Y direction. Moreover, the memory block MB includes a plurality of the memory fingers MF arranged in the Y direction. Furthermore, the memory finger MF is provided with: a memory region MR where the memory cell MC is positioned; and a contact region CR where the contact portion 102a is positioned. Moreover, as shown in FIG. 6, the memory finger MF includes i (i is a positive integer) layers of conductive layers 102_1 to 102_i.

As shown in FIG. 5, the memory region MR of the conductive layers 102_1 to 102_i is provided with a plurality of memory holes MH. These memory holes MH are provided in a staggered shape in the XY directions. Note that an arrangement in the XY directions of the memory holes MH may be appropriately adjusted to a triangular arrangement or a square arrangement, and so on. Moreover, as shown in FIG. 6, the memory hole MH is a through hole that penetrates the conductive layers 102_1 to 102_i, and the inside of the memory hole MH is provided with the memory columnar body 105, the tunnel insulating layer 123, and the charge accumulation layer 124 described with reference to FIG. 4. Moreover, the conductive layers 102_1 to 102_i are covered by the block insulating layer 125, and are stacked above the substrate 101 via an insulating layer 112.

As shown in FIG. 6, in the present embodiment, the lowermost layer source side select gate transistor STSb is provided at an intersection of a one-layer portion of the conductive layers 102 and the memory columnar body 105. Moreover, the source side select gate transistor STS is provided at an intersection of a three-layer portion of the conductive layers 102 and the memory columnar body 105. Furthermore, the drain side select gate transistor STD is provided at an intersection of a four-layer portion of the conductive layers 102 and the memory columnar body 105. Therefore, in the present embodiment, the conductive layer 102_1 functions as the lowermost layer source side select gate line SGSb and as the control gate electrode of the lowermost layer source side select gate transistor STSb; the conductive layers 102_2 to 102_4 function as the source side select gate line SGS and as the control gate electrode of the source side select gate transistor STS; the conductive layers 102_5 to 102_i-4 function as the word lines WL and as the control gates of the memory cells MC; and the conductive layers 102_i-3 to 102_i function as the drain side select gate line SGD and as the control gate electrode of the drain side select gate transistor STD.

As shown in FIG. 5, the conductive layers 102_1 to 102_i are arranged in plurality in the Y direction via a first trench ST1 and a second trench ST2 that extend in the X direction. The first trench ST1 is positioned at a boundary of the plurality of memory blocks MB. The second trench ST2 is positioned at a boundary of the plurality of memory fingers MF. Moreover, the first trench ST1 and the second trench ST2 are implanted with an insulating layer 113 and the unillustrated conductive layer 108 (source contact LI, refer to FIG. 3). Note that the insulating layer 113 is positioned on each of both side surfaces in the Y direction of the conductive layer 108.

As shown in FIG. 6, the conductive layers 102_1 to 102_i are respectively connected to via contact wiring lines 109_1 to 109_i that have the Z direction as their longitudinal direction. As shown in FIG. 5, the via contact wiring lines 109_1 to 109_i are provided one each to every one memory finger MF. Moreover, a periphery of the via contact wiring lines 109_1 to 109_i of the conductive layers 102_1 to 102_i is provided with a plurality of through holes, and these plurality of through holes each have the support 111 inserted therein.

As shown in FIG. 5, in the present embodiment, center positions in the Y direction of the via contact wiring lines 109_1 to 109_6 are out of alignment with center positions in the Y direction of the conductive layers 102_1 to 102_6. Moreover, a certain pair of the via contact wiring lines 109 (for example, the via contact wiring line 109A and the via contact wiring line 109B in FIG. 5) are out of alignment so as to be close to each other in the Y direction via the second trench ST2. For example, a position in the Y direction of the via contact wiring line 109A is closer to the via contact wiring line 109B than is a center position in the Y direction of the conductive layer 102_1. Similarly, a position in the Y direction of the via contact wiring line 109B is closer to the via contact wiring line 109A than is a center position in the Y direction of the conductive layer 102_1. Moreover, another pair of the via contact wiring lines 109 (for example, the via contact wiring line 109B and the via contact wiring line 109C in FIG. 5) are out of alignment so as to be far from each other in the Y direction via the second trench ST2. For example, a position in the Y direction of the via contact wiring line 109B is further from the via contact wiring line 109C than is a center position in the Y direction of the conductive layer 102_1. Similarly, a position in the Y direction of the via contact wiring line 109C is further from the via contact wiring line 109B than is a center position in the Y direction of the conductive layer 102_1. Note that in the example shown in FIG. 5, the via contact wiring lines 109_1 to 109_6 included in each of the memory fingers MF are all out of alignment in the same direction. In addition, the contact portions 102a of the conductive layers 102_1 to 102_6 are each provided with three supports 111. These three supports 111 are provided at positions corresponding to vertices of a triangle. Moreover, the via contact wiring lines 109_1 to 109_6 are positioned outside this triangle.

Note that as shown in FIG. 5, in the present embodiment, center positions in the Y direction of the via contact wiring lines 109_i-4 to 109_i substantially match center positions in the Y direction of the conductive layers 102_i-4 to 102_i. Moreover, the contact portions 102a of the conductive layers 102_i-4 to 102_i are each provided with four supports 111. These four supports 111 are provided at positions corresponding to vertices of a square or rectangle. Moreover, the via contact wiring lines 109_i-4 to 109_i are positioned inside this square or rectangle.

As shown in FIG. 6, the via contact wiring lines 109_1 to 109_i are respectively connected to the wiring lines 110 provided in the wiring line layers LL_1 to LL_k, and are connected to the row decoders 2 and 3 (FIGS. 1 and 2) via these wiring lines 110. As shown in FIG. 6, in the present embodiment, the plurality of conductive layers 102_1 to 102_i are formed in steps, hence the lower a layer in which a conductive layer 102 is positioned, the further from the memory region MR is a position at which its contact portion 102a is provided, and the higher a layer in which a conductive layer 102 is positioned, the closer to the memory region MR is a position at which its contact portion 102a is provided. Moreover, the lower a layer in which a conductive layer 102 is positioned, the lower positioned is the layer of the wiring line 110 by which it is led out in the X direction, and the higher a layer in which a conductive layer 102 is positioned, the higher positioned is the layer of the wiring line 110 by which it is led out in the X direction.

As shown in FIG. 7, the wiring line layer LL_1 is provided with a plurality of wiring lines 110_1_1 to 110_1_i-4.

As shown in FIG. 7, the wiring line 110_1_1 includes: a contact portion 110a_1_1 extending in the Y direction; and a lead-out portion 110b_1_1 extending in the X direction. The contact portion 110a_1_1 commonly electrically connects a pair of via contact wiring lines 109_1 provided so as to be close to each other in the Y direction via the second trench ST2. For example, the wiring line 110A is commonly connected to the via contact wiring line 109A and the via contact wiring line 109B described with reference to FIG. 5. Moreover, the wiring lines 110_1_1 are provided one each to every two memory fingers MF, and are separated from each other in the Y direction. Moreover, a pair of via contact wiring lines 109_1 provided so as to be far from each other in the Y direction via the second trench ST2 are connected to different wiring lines 110_1_1. For example, the via contact wiring line 109B and the via contact wiring line 109C described with reference to FIG. 5 are connected to different wiring lines 110A and 110B.

As shown in FIG. 7, the wiring line 110_1_2 includes: a contact portion 110a_1_2 extending in the X direction and the Y direction; and a lead-out portion 110b_1_2 extending in the X direction. The contact portion 110a_1_2 commonly electrically connects three pairs of via contact wiring lines 109_2 to 109_4 each provided to as to be close to each other in the Y direction via the second trench ST2. Moreover, the wiring lines 110_1_2 are provided one each to every two memory fingers MF, and are separated from each other in the Y direction. Moreover, three pairs of via contact wiring lines 109_2 to 109_4 provided so as to be far from each other in the Y direction via the second trench ST2 are connected to different wiring lines 110_1_2. Furthermore, the lead-out portion 110b_1_2 extends in the X direction passing between a pair of the wiring lines 110_1_1 adjacent in the Y direction. For example, the lead-out portion of the wiring line 110C is led out in the X direction passing between the wiring line 110A and the wiring line 110B.

As shown in FIG. 7, the wiring line 110_1_5 includes: a contact portion 110a_1_5 extending in the Y direction; and a lead-out portion 110b_1_5 extending in the X direction. The contact portion 110a_1_5 is commonly connected to each of a plurality of (four in the example shown in FIG. 7) via contact wiring lines 109_5. Moreover, a center position of the via contact wiring line 109_5 positioned at an end in the Y direction of the plurality of via contact wiring lines 109_5 connected to the wiring line 110_1_5 is provided at a position closer to a center position in the Y direction of the contact portion 110a_1_5 than is a center position in the Y direction of the memory finger MF. Moreover, the lead-out portion 110b_1_5 extends in the X direction passing between a pair of the wiring lines 110_1_1 and a pair of the wiring lines 110_1_2 adjacent in the Y direction.

As shown in FIG. 7, the wiring line 110_1_6 is configured substantially similarly to the wiring line 110_1_5, and includes: a contact portion 110a_1_6 extending in the Y direction; and a lead-out portion 110b_1_6 extending in the X direction. Moreover, the contact portion 110a_1_6 is commonly connected to each of a plurality of (four in the example shown in FIG. 7) via contact wiring lines 109_6.

As shown in FIG. 7, the wiring line layer LL_1 is provided with a wiring line 110_1_i on a memory finger MF basis. The wiring line 110_1_i commonly connects on a memory finger MF basis the conductive layers 102_i-3 to 102_i each extending in the X direction and functioning as the drain side select gate line SGD. That is, the wiring line 110_1_i is commonly connected to each of a plurality of (four in the example shown in FIG. 7) via contact wiring lines 109_i-3 to 109_i.

Similarly hereafter, the wiring lines 110 in the wiring line layers LL_2 to LL_k are connected to the conductive layers 102_7 to 102_i-4, and are led out in the X direction. Moreover, as shown in FIG. 8, wiring lines 110_k_i-3 to 110_k_i in the uppermost layer wiring line layer LL_k comprise: portions respectively connected independently to the plurality of wiring lines 110_1_i; and portions led out in the X direction.

In the semiconductor memory device, the word lines WL and the source side select gate line SGS are commonly connected to the plurality of memory fingers MF included in one memory block MB. This makes it possible to reduce the number of wiring lines 110 and furthermore to reduce the number of layers k of the wiring line layers LL_1 to LL_k described with reference to FIGS. 5 to 8, thereby reducing manufacturing costs of the semiconductor memory device.

Moreover, as described with reference to FIG. 5, in the present embodiment, a certain pair of via contact wiring lines 109_1 are out of alignment so as to be close to each other in the Y direction via the second trench ST2. Moreover, as described with reference to FIG. 6, in the present embodiment, these pair of via contact wiring lines 109_1 are connected to a common wiring line 110_1_1. Therefore, it is made possible to reduce a width in the Y direction of the contact portion 110a_1_1 and pass the lead-out portion of another wiring line 110 (for example, the lead-out portion 110b_1_2, and so on) between contact portions 110a_1_1 adjacent in the Y direction, proportionately to the extent that a position of the via contact wiring line 109 is out of alignment. Therefore, it is possible to increase the number of wiring lines 110 led out in the X direction in the wiring line layer LL_1 to suitably connect the conductive layers 102_1 to 102_i and the row decoders 2 and 3 without increasing the number of layers k of the wiring line layers LL_1 to LL_k.

In other words, in the present embodiment, a certain pair of via contact wiring lines 109_1 are out of alignment so as to be far from each other in the Y direction via the second trench ST2. Furthermore, these pair of via contact wiring lines 109_1 are connected to different wiring lines 110_1_1. Therefore, it is made possible to widen a spacing between the wiring lines 110_1 adjacent in the Y direction and pass a larger number of lead-out portions of other wiring lines 110 (for example, the lead-out portion 110b_1_2, and so on), proportionately to the extent that a position of the via contact wiring line 109_1 is out of alignment. Therefore, it is possible to increase even more the number of wiring lines 110 led out in the X direction in the wiring line layer LL_1 to suitably connect the conductive layers 102_1 to 102_i and the row decoders 2 and 3 without increasing the number of layers k of the wiring line layers LL_1 to LL_k.

Moreover, in the present embodiment, an arrangement of the via contact wiring lines 109_1 to 109_6 led out by the wiring lines 110 in the wiring line layer LL_1 positioned in a lowermost layer is adjusted, and furthermore, a pattern of the wiring lines 110 connected to these via contact wiring lines 109_1 to 109_6 is adjusted. Therefore, it is possible that in the wiring line layer LL_1, a plurality of via contact wiring lines 109_1 to 109_i are commonly connected and the number of wiring lines 110 led out in the wiring line layer LL_1 is increased. However, a wiring line pattern of the kind described with reference to FIG. 7 may also be applied to a second or more layers of wiring line layers.

[Second Embodiment]

Figure 9:
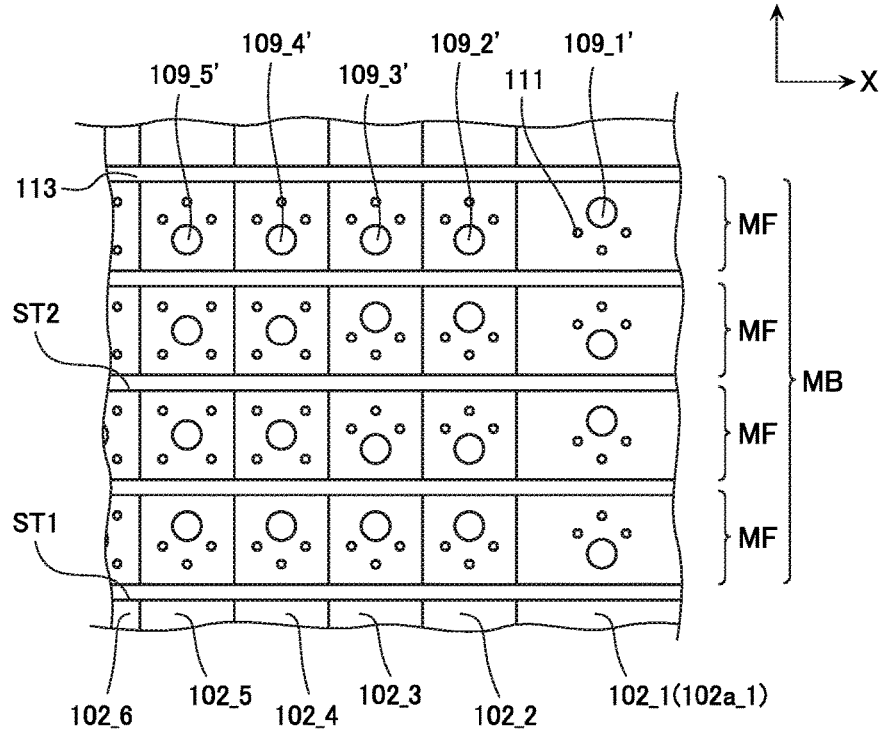
FIG. 9 is a plan view showing a configuration of a semiconductor memory device according to a second embodiment.
Figure 10:
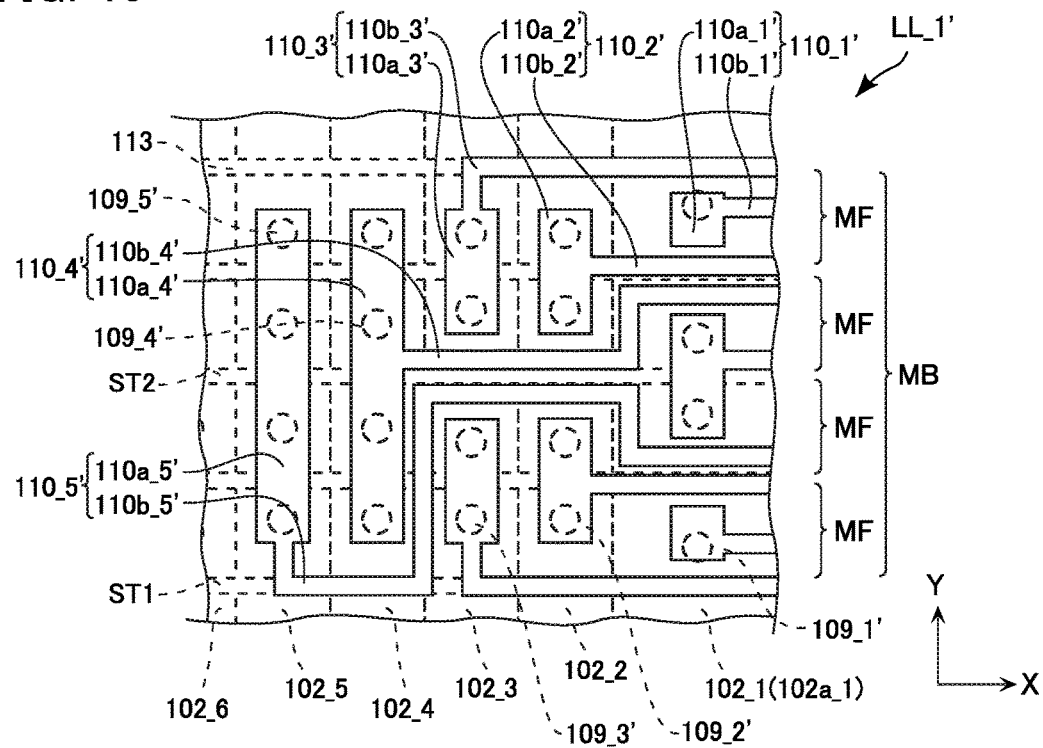
FIG. 10 is a plan view showing the configuration of the same semiconductor memory device.

Next, a nonvolatile semiconductor memory device according to a second embodiment will be described with reference to FIGS. 9 and 10. FIG. 9 is a plan view showing a configuration of part of the semiconductor memory device according to the second embodiment, and shows an arrangement of the conductive layers 102_1 to 102_5, via contact wiring lines 109_1' to 109_5', and the support 111. FIG. 10 is a plan view showing a configuration of part of the same semiconductor memory device, and shows a configuration of a wiring line layer LL_1'. Note that in the description below, portions similar to those of the first embodiment are assigned with similar reference symbols to those assigned in the first embodiment, and descriptions thereof will be omitted.

In the example described with reference to FIG. 5, the via contact wiring lines 109_1 to 109_6 included in each of the memory fingers MF were all out of alignment in the same direction. However, as shown in FIG. 9, directions in which the via contact wiring lines 109 are set out of alignment may differ within the memory finger MF. In this case, as shown in FIG. 10, a wiring line pattern in the wiring line layer LL_1' maybe adjusted. Note that in other portions, the semiconductor memory device is configured similarly to the semiconductor memory device according to the first embodiment.

That is, as shown in FIG. 10, in the present embodiment, a common wiring line 110_1' is connected to a pair of the via contact wiring lines 109_1' positioned on a center side of the memory block MB, and wiring lines 110_1' are connected independently to each of the two via contact wiring lines 109_1' positioned on outer sides of the memory block MB. Moreover, a lead-out portion of another wiring line 110 (for example, the lead-out portion 110b_2') is provided between the wiring lines 110_1' adjacent in the Y direction.

Moreover, as shown in FIGS. 9 and 10, center positions of the pair of via contact wiring lines 109_1' connected to the common wiring line 110_1' are provided at positions closer to the center of a contact portion 110a_1' than are center positions in the Y direction of the memory fingers MF. Moreover, center positions of the two via contact wiring lines 109_1' connected independently to the wiring lines 110_1' are provided at positions further from each other than are center positions in the Y direction of the memory fingers MF.

Moreover, as shown in FIGS. 9 and 10, in the present embodiment, a common wiring line 110_4' is connected to four of the via contact wiring lines 109_4'. Furthermore, center positions of the two via contact wiring lines 109_4' positioned at ends in the Y direction of the four via contact wiring lines 109_4' connected to the wiring line 110_4' are provided at positions closer to the center of a contact portion 110a_4' than are center positions in the Y direction of the memory fingers MF. On the other hand, center positions in the Y direction of the other via contact wiring lines 109_4' connected to the wiring line 110_4' substantially match center positions in the Y direction of the memory fingers MF.

[Third Embodiment]

Figure 11:
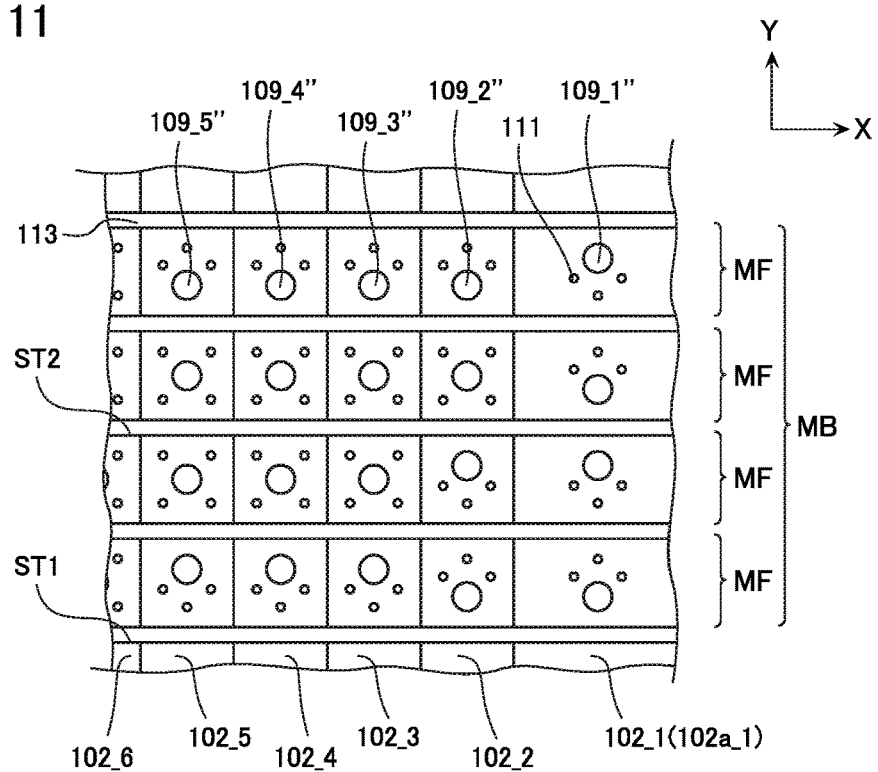
FIG. 11 is a plan view showing a configuration of a semiconductor memory device according to a third embodiment.
Figure 12:
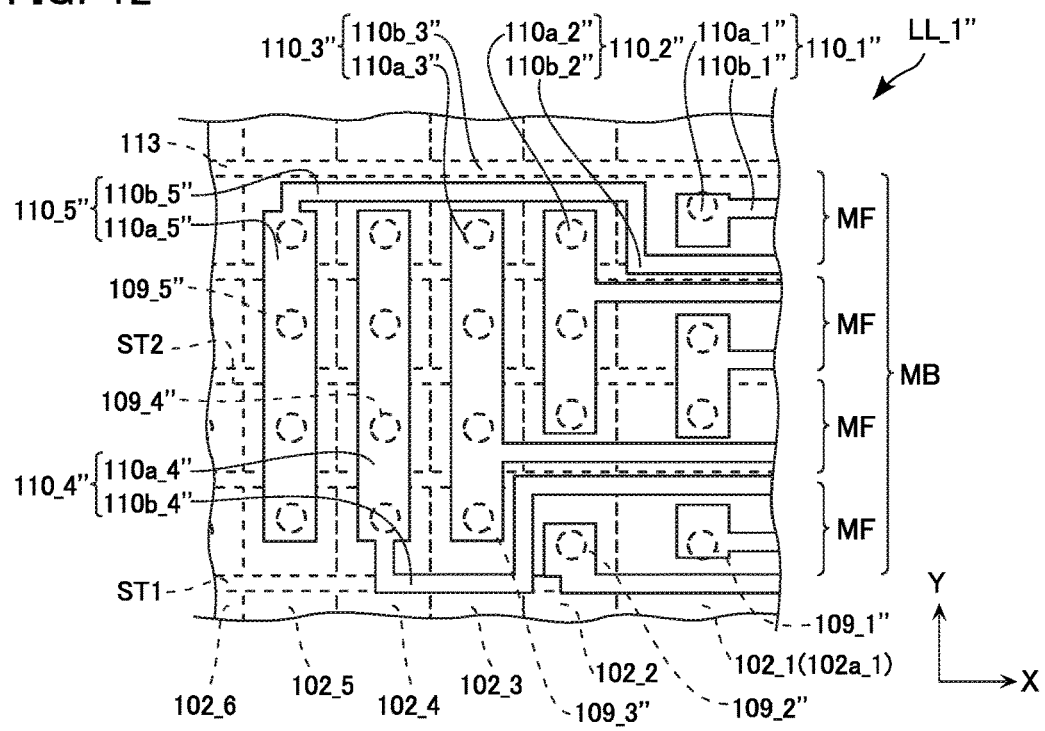
FIG. 12 is a plan view showing the configuration of the same semiconductor memory device.

Next, a nonvolatile semiconductor memory device according to a third embodiment will be described with reference to FIGS. 11 and 12. FIG. 11 is a plan view showing a configuration of part of the semiconductor memory device according to the third embodiment, and shows an arrangement of the conductive layers 102_1 to 102_5, via contact wiring lines 109_1" to 109_5", and the support 111. FIG. 12 is a plan view showing a configuration of part of the same semiconductor memory device, and shows a configuration of a wiring line layer LL_1". Note that in the description below, portions similar to those of the second embodiment are assigned with similar reference symbols to those assigned in the second embodiment, and descriptions thereof will be omitted.

In the first embodiment and the second embodiment, the contact portion 110a of the wiring line 110 was commonly connected to one, two, or four via contact wiring lines 109. However, as shown in, for example, FIGS. 11 and 12, a wiring line 110_2" may be commonly connected to three of the via contact wiring lines 109_2". Moreover, in this case, center positions of the two via contact wiring lines 109_2" positioned at ends in the Y direction of these three via contact wiring lines 109_2" maybe provided at positions closer to the center of a contact portion 110a_2" than are center positions in the Y direction of the memory fingers MF. Furthermore, a center position in the Y direction of the via contact wiring line 109_2" adjacent in the Y direction to these three via contact wiring lines 109_2" maybe adjusted so as to be far from these three via contact wiring lines 109_2".

[Fourth Embodiment]

Figure 13:
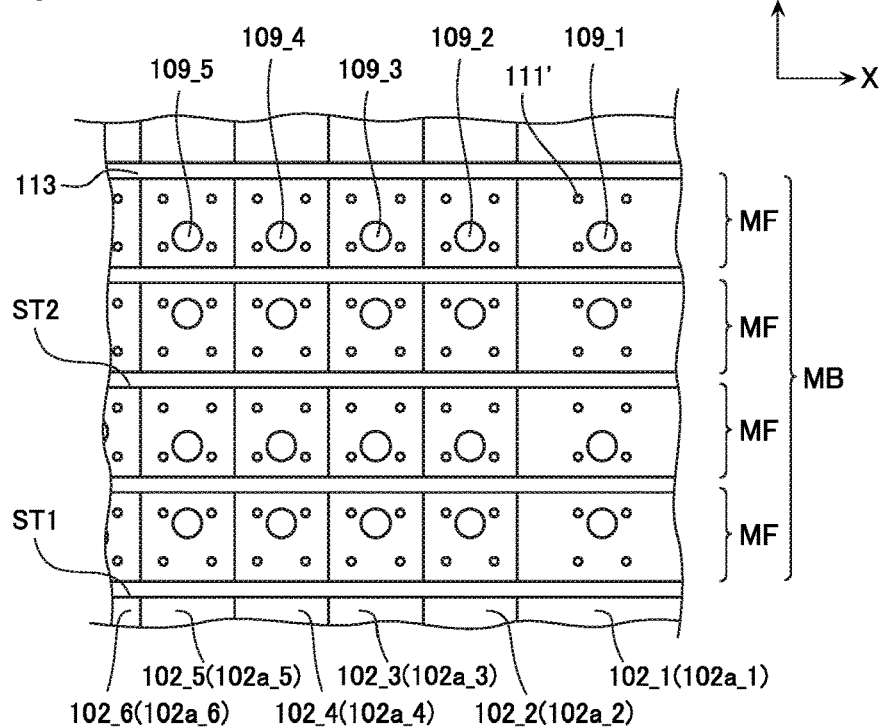
FIG. 13 is a plan view showing a configuration of a semiconductor memory device according to a fourth embodiment.
Figure 14:
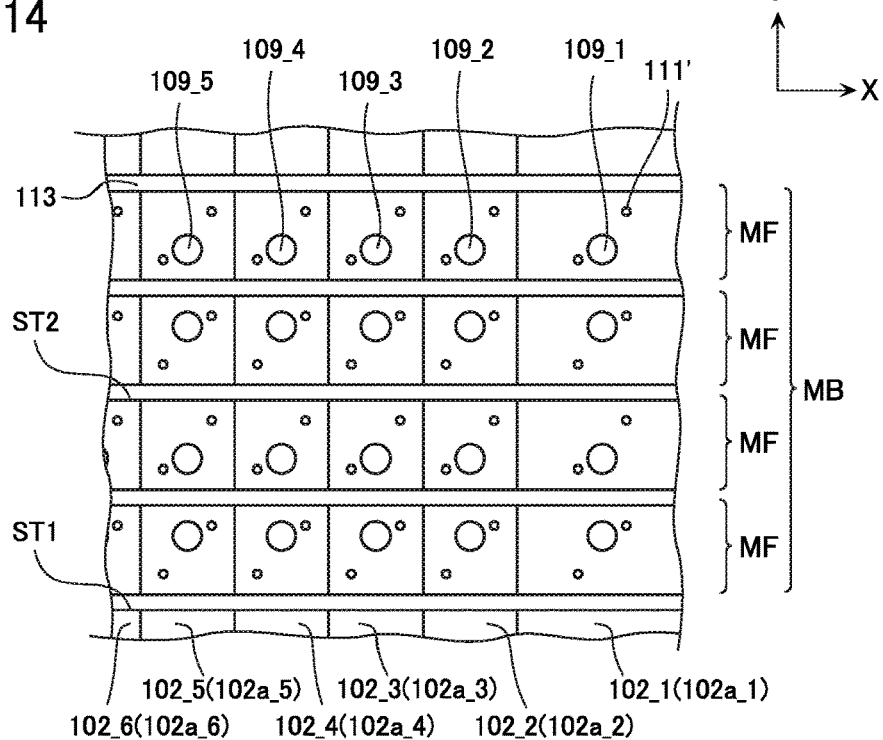
FIG. 14 is a plan view showing another configuration of the same semiconductor memory device.
Figure 15:
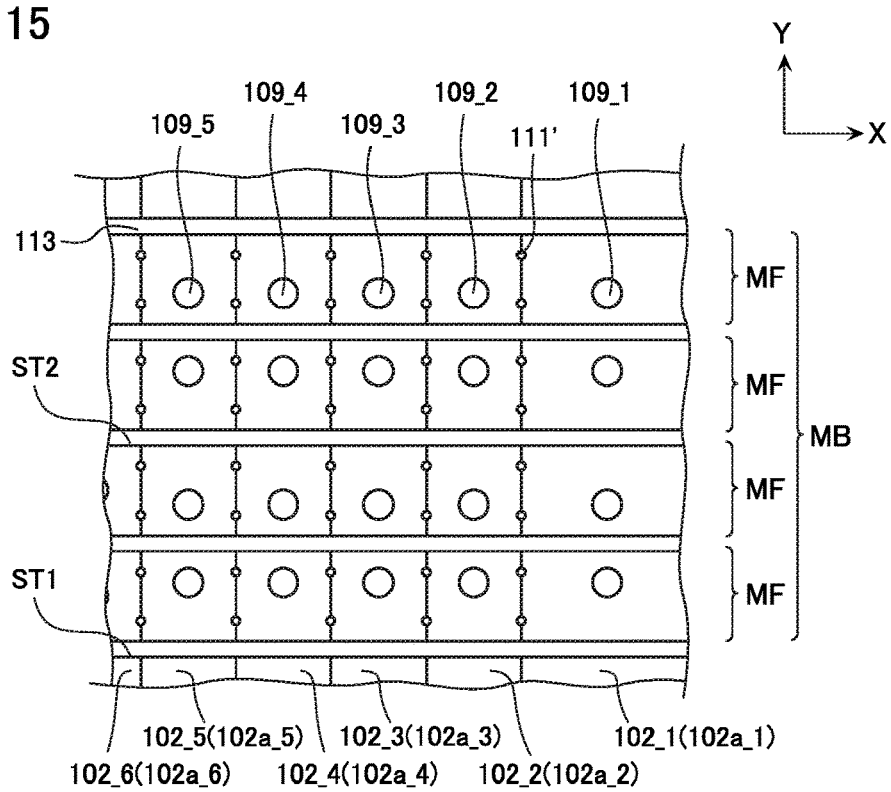
FIG. 15 is a plan view showing another configuration of the same semiconductor memory device.
Figure 16:
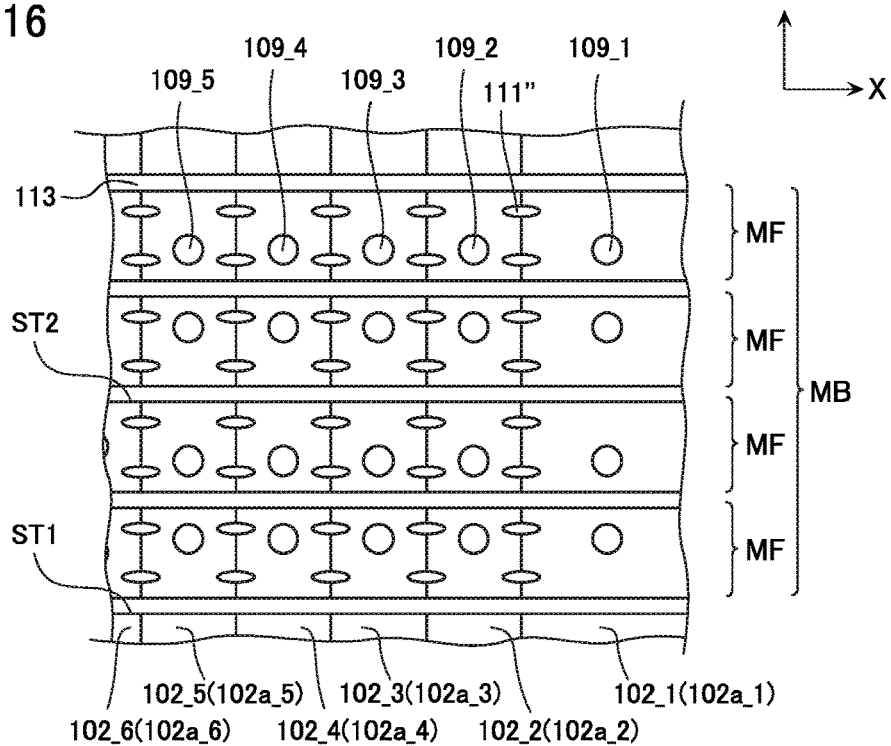
FIG. 16 is a plan view showing another configuration of the same semiconductor memory device.

Next, a nonvolatile semiconductor memory device according to a fourth embodiment will be described with reference to FIGS. 13 to 16. FIG. 13 is a plan view showing a configuration of part of the semiconductor memory device according to the fourth embodiment, and shows an arrangement of the conductive layers 102_1 to 102_5, the via contact wiring lines 109_1 to 109_5, and a support 111'. In addition, FIGS. 14 to 16 are plan views showing other configurations of the same semiconductor memory device, and show arrangements of the via contact wiring lines 109_1 to 109_5, and supports 111', 111", or 111'''. Note that in the description below, portions similar to those of the first embodiment are assigned with similar reference symbols to those assigned in the first embodiment, and descriptions thereof will be omitted.

As shown in FIG. 13, the semiconductor memory device is basically configured similarly to the semiconductor memory device according to the first embodiment, but the support 111' is different. That is, in the first through third embodiments, in the case that the center position in the Y direction of the via contact wiring line 109 was out of alignment, the supports 111 were disposed at positions corresponding to vertices of a triangle, and the via contact wiring line 109 was positioned outside this triangle. However, an arrangement of the supports may be appropriately adjusted. For example, as shown in FIG. 13, even when the center position in the Y direction of the via contact wiring line 109 is set out of alignment, the contact regions 102a of the conductive layers 102_1 to 102_6 may each be provided with four of the supports 111, similarly to when the center position in the Y direction of the via contact is not set out of alignment. Moreover, these four supports 111 may be provided at positions corresponding to vertices of a square or rectangle. Moreover, the via contact wiring lines 109_1 to 109_6 may be positioned inside this square or rectangle.

In addition, as shown in FIG. 14, the contact regions 102a of the conductive layers 102_1 to 102_6 may each be provided with two of the supports 111'. Moreover, these supports 111' may be disposed on a line intersecting the X direction and the Y direction. Furthermore, center positions of the via contact wiring lines 109_1 to 109_6 maybe distanced from a line segment having these two supports as its start point and end point.

Moreover, as shown in FIG. 15, two of the supports 111' maybe provided at a boundary of two of the contact regions 102a adjacent in the X direction, so as to straddle the contact regions 102a of two of the conductive layers 102. In this case, the support 111' is inserted in a through hole provided in the conductive layer positioned in a layer below (for example, the conductive layer 102_1), and contacts a sidewall of the conductive layer positioned in a layer above (for example, the conductive layer 102_2), from the X direction.

In addition, as shown in FIG. 16, the support 111" whose width in the X direction is larger than its width in the Y direction may be adopted, and disposed similarly to in the example shown in FIG. 15.

In addition, an arrangement, and so on, of the supports 111 may be appropriately adjusted. For example, any number of the supports may be disposed in the contact region 102a. Moreover, these plurality of supports may be disposed at vertices of a polygon other than a triangle and a square. Furthermore, the via contact wiring line 109 may be positioned inside such a polygon, or may be positioned outside such a polygon. Note that, in order to support the posture of the insulating layer provided between the conductive layers 102 in a manufacturing process, it is desirable that at least two supports having different positions in the X direction and the Y direction are provided in the contact region 102a.

Furthermore, as described with reference to, for example, FIG. 15 or 16, the support 111 may be provided at a boundary of two of the contact regions 102a adjacent in the X direction. Furthermore, the support may be provided in both a boundary portion of the contact regions 102a and inside the contact region 102a. In this case also, in order to support the posture of the insulating layer provided between the conductive layers 102 in a manufacturing process, it is desirable that at least two supports having different positions in the X direction and the Y direction contact each of the contact regions 102a.

Furthermore, a support whose width in the X direction and width in the Y direction differ of the kind described with reference to FIG. 16 may be used, whichever way the supports 111 are arranged.

[Fifth Embodiment]

Figure 17:
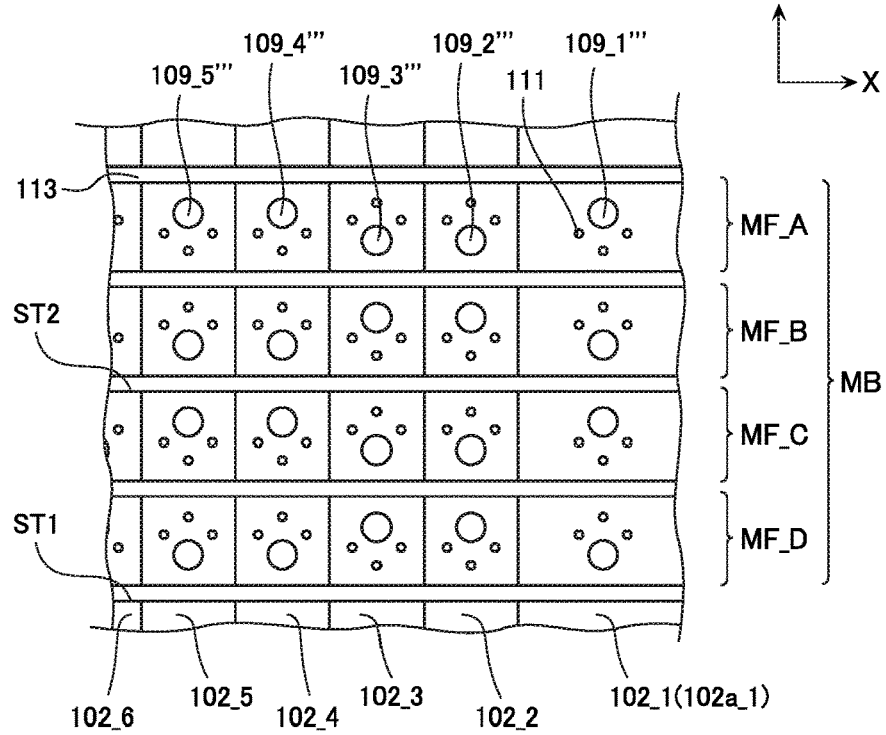
FIG. 17 is a plan view showing a configuration of a semiconductor memory device according to a fifth embodiment.
Figure 18:
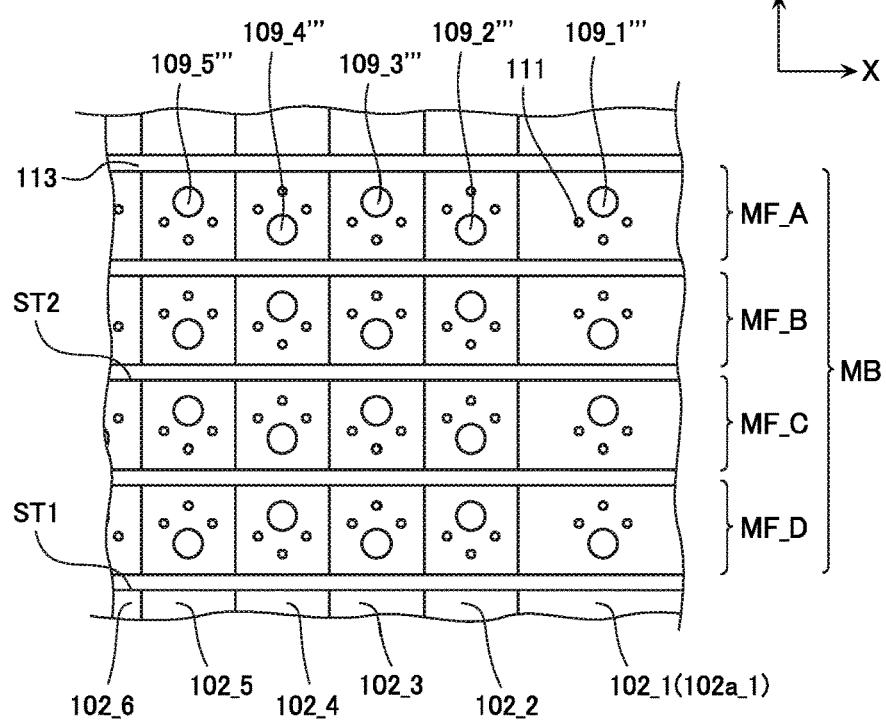
FIG. 18 is a plan view showing another configuration of the same semiconductor memory device.
Figure 19:
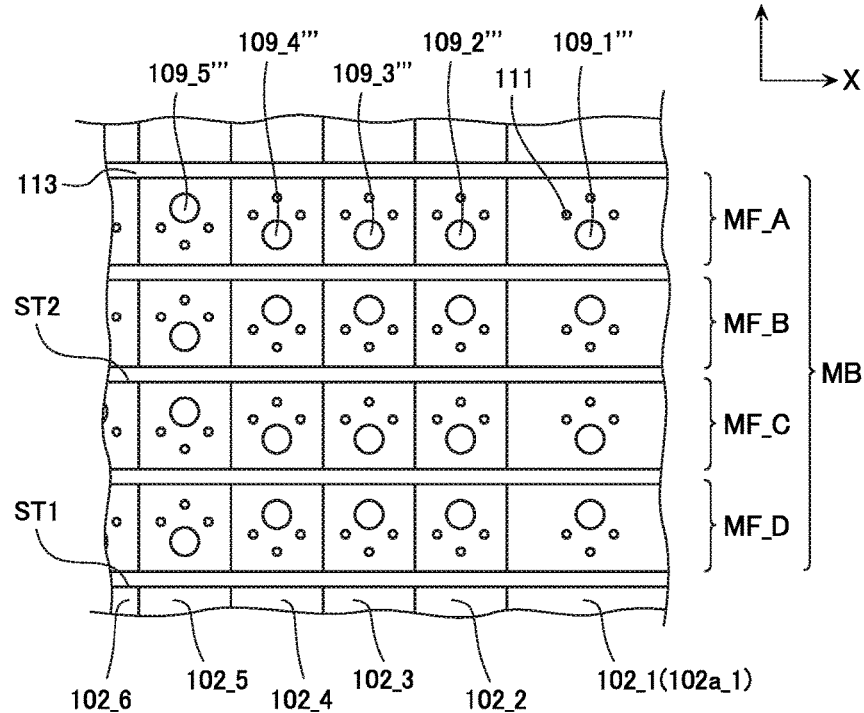
FIG. 19 is a plan view showing another configuration of the same semiconductor memory device.
Figure 20:
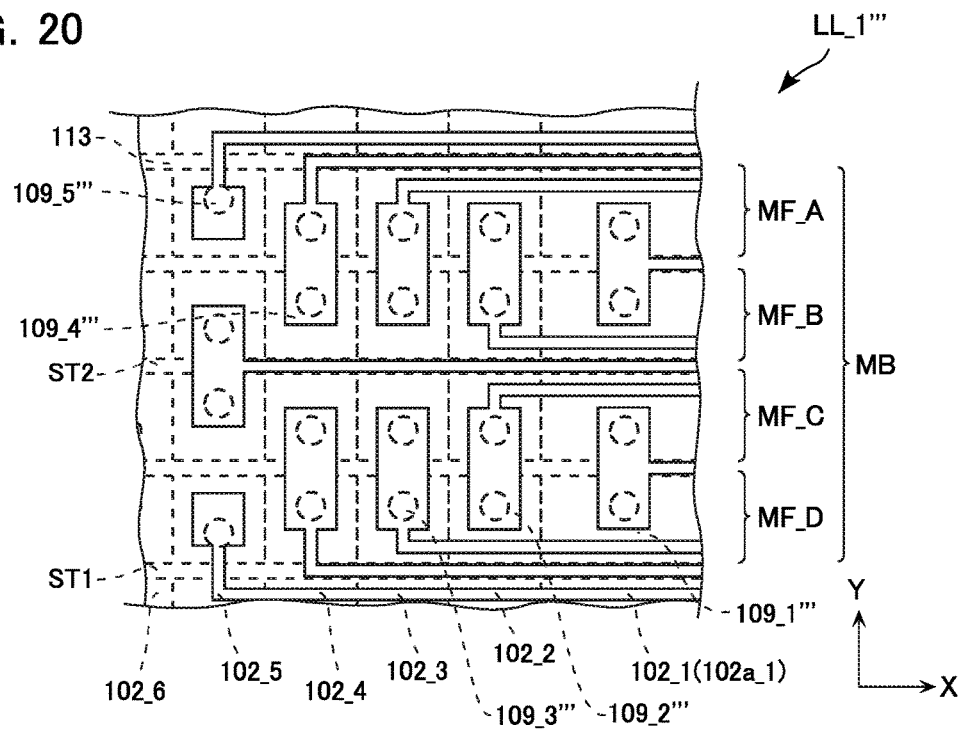
FIG. 20 is a plan view showing another configuration of the same semiconductor memory device.

Next, a nonvolatile semiconductor memory device according to a fifth embodiment will be described with reference to FIGS. 17 to 20. FIG. 17 is a plan view showing a configuration of part of the semiconductor memory device according to the fifth embodiment, and shows an arrangement of the conductive layers 102_1 to 102_5, via contact wiring lines 109_1''' to 109_5''', and the support 111. FIGS. 18 and 19 are plan views showing other configurations of the same semiconductor memory device. Furthermore, FIG. 20 shows a configuration of a wiring line layer LL_1''' connected to the via contact wiring lines 109_1''' to 109_5''' shown in FIG. 19. Note that in the description below, portions similar to those of the first embodiment are assigned with similar reference symbols to those assigned in the first embodiment, and descriptions thereof will be omitted.

As shown in FIG. 17, in the present embodiment, directions in which the via contact wiring lines 109''' are set out of alignment change periodically every four. That is, focusing on the memory fingers MF_A and MF_C in FIG. 17, center positions in the Y direction of the via contact wiring lines 109_4n-3''' (n is a positive integer) and 109_4n''' are out of alignment in an upward direction in FIG. 17 from the center position in the Y direction of the conductive layer 102. On the other hand, center positions in the Y direction of the via contact wiring lines 109_4n-2''' (n is a positive integer) and 109_4n-1''' are out of alignment in a downward direction in FIG. 17 from the center position in the Y direction of the conductive layer 102. Furthermore, the via contact wiring lines 109''' of the memory fingers MF_B and MF_D in FIG. 17 are out of alignment in opposite directions to the via contact wiring lines 109''' of the memory fingers MF_A and MF_C.

In the example shown in FIG. 17, the via contact wiring lines 109''' are arranged as a periodic pattern. When the via contact wiring lines 109''' are arranged in this way, positioning of the contact wiring lines 109''' (lithography, and so on) or formation of contact holes implanted with the via contact wiring lines 109''', and so on, may be performed more easily compared to in the first embodiment. Therefore, the semiconductor memory device according to the present embodiment can be easily manufactured.

Note that in the example shown in FIG. 17, the directions in which the via contact wiring lines 109''' are set out of alignment change periodically every four. However, as shown in, for example, FIG. 18, the directions in which the via contact wiring lines 109''' are set out of alignment may change periodically every two, or as shown in FIG. 19, may change periodically every eight. That is, a period with which the via contact wiring lines 109''' are set out of alignment may be appropriately changed.

[Other Embodiments]

In the first through fifth embodiments, the via contact wiring lines 109 were set out of alignment in the Y direction, whereby the spacing of fellow wiring lines 110 adjacent in the Y direction was widened, and lead-out portions of other wiring lines 110 extending in the X direction were passed through this spacing. However, it is conceivable that for example, a certain via contact wiring line 109 is set out of alignment in the X direction, a spacing of fellow wiring lines 110 in the X direction is widened, and a portion extending in the Y direction of the lead-out portion of another wiring line 110 passes through this spacing.

Moreover, the first through fifth embodiments described configurations in which four memory fingers MF are included in one memory block MB. However, the number of memory fingers MF included in the memory block MB may be appropriately adjusted. Therefore, the number of via contact wiring lines 109 bunched by one wiring line 110, and so on, may also be appropriately adjusted.

Figure 21:
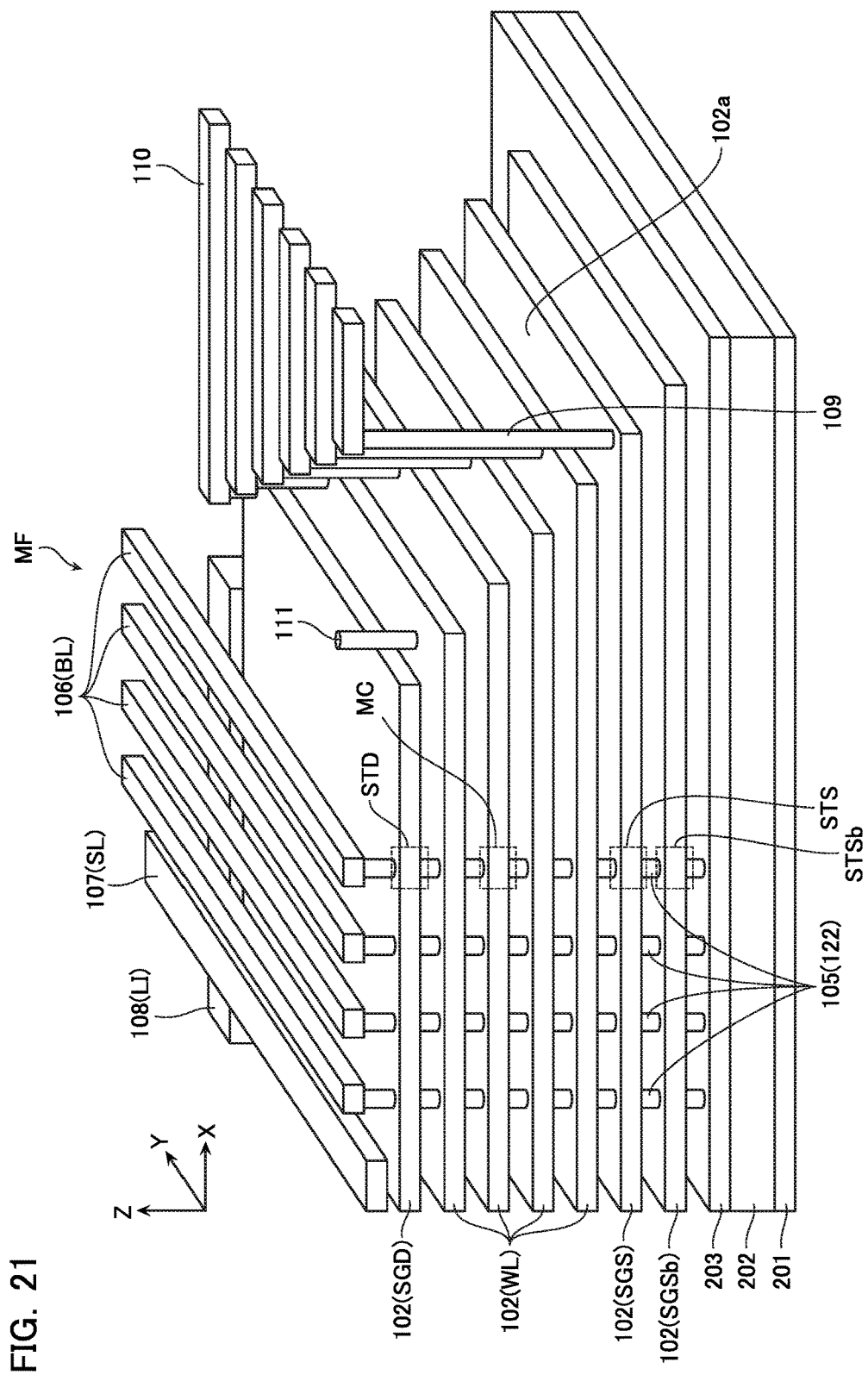
FIG. 21 is a perspective view showing the configuration of another configuration of semiconductor memory device.

Moreover, as shown in FIG. 21, between substrate 201 and the plurality of conductive layers 102, a circuit layer 202 and conductive layer 203 can be provided. The substrate 201 is a semiconductor substrate. The circuit layer 202 includes, for example, FETs (Field Effect Transistors), wirings, and so on. The conductive layer 203 can be configured from a semiconductor layer of the likes of polysilicon, configured from a metal layer of the likes of tungsten (W), or the like. The conductive layer 203 can be connected to lower end of the memory columnar body and the conductive layer 108 which functions as the source contact LI.

[Others]

While certain embodiments have been described, these embodiments have been presented byway of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate;
a plurality of control gate electrodes stacked above the substrate, the plurality of the control gate electrodes including first through fourth contact region, the first contact region and the second contact region being arranged in a first direction, the third contact region and the fourth contact region being arranged in the first direction, the first contact region and the third contact region being arranged in a second direction, the second contact region and the fourth contact region being arranged in the second direction, the second direction crossing the first direction;
a semiconductor layer extending in a third direction crossing the substrate, the semiconductor layer facing a plurality of the control gate electrodes; and
first through fourth via contacts connected to the first through fourth contact regions,
a distance between a center position of the first via contact and a center position of the third via contact in the second direction being larger than a distance between a center position of the second via contact and a center position of the fourth via contact in the second direction.

2. The semiconductor memory device according to claim 1, further comprising:
a first wiring line connected to the first via contact;
a second wiring line connected to the third via contact; and
a third wiring line connected to at least one of the second via contact and the fourth via contact,
at least a part of the third wiring line being between the first wiring line and the second wiring line.

3. The semiconductor memory device according to claim 2,
the first through third wiring lines being provided in an identical wiring line layer.

4. The semiconductor memory device according to claim 2,
each of the first through third wiring lines includes a contact portion and a lead-out portion, the lead-out portion extending in the first direction.

5. The semiconductor memory device according to claim 4,
the contact portion of the third wiring line being between the lead-out portion of the first wiring line and the lead-out portion of the second wiring line.

6. The semiconductor memory device according to claim 4,
the lead-out portion of the third wiring line being between the contact portion of the first wiring line and the contact portion of the second wiring line.

7. The semiconductor memory device according to claim 1,
the plurality of the control gate electrodes including first through fourth control gate electrodes,
the first control gate electrode including the first contact region,
the second control gate electrode including the second contact region,
the third control gate electrode including the third contact region, and
the fourth control gate electrode including the fourth contact region.

8. The semiconductor memory device according to claim 7,
a distance between the substrate and the first control gate electrode being smaller than a distance between the substrate and the second control gate electrode, and
a distance between the substrate and the third control gate electrode being smaller than a distance between the substrate and the fourth control gate electrode.

9. The semiconductor memory device according to claim 7,
a distance between the substrate and the first control gate electrode being larger than a distance between the substrate and the second control gate electrode, and
a distance between the substrate and the third control gate electrode being larger than a distance between the substrate and the fourth control gate electrode.

10. The semiconductor memory device according to claim 1,
a position in the second direction of the first via contact being further from the third via contact than is a center position in the second direction of the first contact region,
a position in the second direction of the third via contact being further from the first via contact than is a center position in the second direction of the third contact region,
a position in the second direction of the second via contact being nearer to the fourth via contact than is a center position in the second direction of the second contact region,
a position in the second direction of the fourth via contact being nearer to the second via contact than is a center position in the second direction of the fourth contact region.

11. A semiconductor memory device, comprising:
a substrate;
a plurality of control gate electrodes stacked above the substrate, the plurality of the control gate electrodes including first through sixth contact region, the first contact region and the second contact region being arranged in a first direction, the third contact region and the fourth contact region being arranged in the first direction, the fifth contact region and the sixth contact region being arranged in the first direction, the first contact region, the third contact region and the fifth contact region being arranged in a second direction, the second contact region, the fourth contact region and the sixth contact region being arranged in the second direction, the second direction crossing the first direction;
a semiconductor layer extending in a third direction crossing the substrate, the semiconductor layer facing a plurality of the control gate electrodes; and
first through sixth via contacts connected to the first through sixth contact regions, a distance between the first via contact and the third via contact being larger than a distance between the second via contact and the fourth via contact, and a distance between the third via contact and the fifth via contact being smaller than a distance between the fourth via contact and the sixth via contact.

12. The semiconductor memory device according to claim 11, further comprising:
a first wiring line connected to the first via contact;
a second wiring line connected to the third via contact; and
a third wiring line connected to at least one of the second via contact and the fourth via contact,
at least a part of the third wiring line being between the first wiring line and the second wiring line.

13. The semiconductor memory device according to claim 12,
the first through third wiring lines being provided in an identical wiring line layer.

14. The semiconductor memory device according to claim 12,
each of the first through third wiring lines includes a contact portion and a lead-out portion, the lead-out portion extending in the first direction.

15. The semiconductor memory device according to claim 14,
the contact portion of the third wiring line being between the lead-out portion of the first wiring line and the lead-out portion of the second wiring line.

16. The semiconductor memory device according to claim 14,
the lead-out portion of the third wiring line being between the contact portion of the first wiring line and the contact portion of the second wiring line.

17. The semiconductor memory device according to claim 11,
the plurality of the control gate electrodes including first through fourth control gate electrodes,
the first control gate electrode including the first contact region,
the second control gate electrode including the second contact region,
the third control gate electrode including the third contact region, and
the fourth control gate electrode including the fourth contact region.

18. The semiconductor memory device according to claim 17,
a distance between the substrate and the first control gate electrode being smaller than a distance between the substrate and the second control gate electrode, and
a distance between the substrate and the third control gate electrode being smaller than a distance between the substrate and the fourth control gate electrode.

19. The semiconductor memory device according to claim 17,
a distance between the substrate and the first control gate electrode being larger than a distance between the substrate and the second control gate electrode, and
a distance between the substrate and the third control gate electrode being larger than a distance between the substrate and the fourth control gate electrode.

20. The semiconductor memory device according to claim 11,
a position in the second direction of the first via contact being further from the third via contact than is a center position in the second direction of the first contact region,
a position in the second direction of the third via contact being further from the first via contact than is a center position in the second direction of the third contact region,
a position in the second direction of the second via contact being nearer to the fourth via contact than is a center position in the second direction of the second contact region,
a position in the second direction of the fourth via contact being nearer to the second via contact than is a center position in the second direction of the fourth contact region.

* * * * *